United States Patent
Vix

(10) Patent No.: US 10,580,677 B2
(45) Date of Patent: Mar. 3, 2020

(54) POSITIONING ARRANGEMENT

(71) Applicant: Schneeberger Holding AG, Roggwil (CH)

(72) Inventor: Martin Vix, Riken (CH)

(73) Assignee: SCHNEEBERGER HOLDING AG, Roggwil (CH)

( * ) Notice: Subject to any disclaimer, the term of this patent is extended or adjusted under 35 U.S.C. 154(b) by 196 days.

(21) Appl. No.: 15/261,299

(22) Filed: Sep. 9, 2016

(65) Prior Publication Data

US 2017/0076966 A1  Mar. 16, 2017

(30) Foreign Application Priority Data

Sep. 10, 2015 (EP) ..................................... 15405055

(51) Int. Cl.
| | | |
|---|---|---|
| *H01L 21/68* | (2006.01) | |
| *B23Q 1/38* | (2006.01) | |
| *B23Q 1/01* | (2006.01) | |
| *B23Q 11/00* | (2006.01) | |
| *H01L 21/687* | (2006.01) | |

(52) U.S. Cl.
CPC .............. *H01L 21/68* (2013.01); *B23Q 1/015* (2013.01); *B23Q 1/38* (2013.01); *B23Q 11/0032* (2013.01); *H01L 21/68757* (2013.01)

(58) Field of Classification Search
CPC . B23Q 1/01; B23Q 1/015; B23Q 1/36; B23Q 1/38
See application file for complete search history.

(56) References Cited

U.S. PATENT DOCUMENTS

| | | | | | |
|---|---|---|---|---|---|
| 4,138,822 | A | * | 2/1979 | Parodi .................... | B23Q 1/015 33/572 |
| 4,155,173 | A | * | 5/1979 | Sprandel ................ | G01B 5/008 33/1 M |
| 4,227,752 | A | * | 10/1980 | Wilcock ................ | F16C 17/042 384/106 |
| 4,234,175 | A | * | 11/1980 | Sato ....................... | F16C 29/025 269/73 |

(Continued)

FOREIGN PATENT DOCUMENTS

| | | |
|---|---|---|
| EP | 2 564 982 A1 | 3/2013 |
| GB | 2 082 484 A | 3/1982 |

(Continued)

OTHER PUBLICATIONS

The above references were cited in an EP search report dated Mar. 11, 2016 in priority application EP 15405055.3.

*Primary Examiner* — Tyrone V Hall, Jr.
(74) *Attorney, Agent, or Firm* — Cowan, Liebowitz & Latman, P.C.; Mark Montague

(57) ABSTRACT

A workpiece positioning arrangement comprises a positioning device for positioning a workpiece as well as a decoupling device for the decoupled storage of the positioning device, wherein the decoupling device comprises a carrier element, on which the positioning device is arranged, and a base element, on which the carrier element is supported. For decoupling the dynamic reaction forces of the positioning device on the base element, the carrier element is supported on the base element so as to move freely at least in a certain range, preferably essentially free of counterforces, in a sliding manner.

15 Claims, 6 Drawing Sheets

(56) References Cited

U.S. PATENT DOCUMENTS

| | | | | | |
|---|---|---|---|---|---|
| 4,392,642 | A | * | 7/1983 | Chitayat | B23Q 1/385 |
| | | | | | 250/442.11 |
| 4,492,356 | A | * | 1/1985 | Taniguchi | B23Q 1/34 |
| | | | | | 144/144.1 |
| 4,505,464 | A | * | 3/1985 | Chitayat | B23Q 1/015 |
| | | | | | 269/21 |
| 4,571,799 | A | * | 2/1986 | Chitayat | B23Q 1/385 |
| | | | | | 108/137 |
| 4,676,492 | A | * | 6/1987 | Shamir | B23Q 1/621 |
| | | | | | 269/73 |
| 4,834,353 | A | * | 5/1989 | Chitayat | B23Q 1/262 |
| | | | | | 269/289 MR |
| 5,022,619 | A | * | 6/1991 | Mamada | H01L 21/68 |
| | | | | | 248/187.1 |
| 5,157,822 | A | * | 10/1992 | Farley | B23P 23/00 |
| | | | | | 219/121.39 |
| 6,238,092 | B1 | * | 5/2001 | Carlson | B23Q 1/012 |
| | | | | | 384/12 |

FOREIGN PATENT DOCUMENTS

| | | | | |
|---|---|---|---|---|
| JP | S60 238709 A | | 11/1985 | |
| WO | WO-2013030189 A1 | * | 3/2013 | B23Q 1/015 |

\* cited by examiner

POSITIONING ARRANGEMENT

BACKGROUND OF THE INVENTION

1. Field of the Invention

The invention relates to a workpiece positioning arrangement, which comprises a positioning device for positioning a workpiece as well as a decoupling device for the decoupled storage of the positioning device, wherein the decoupling device comprises a carrier element, on which the positioning device is arranged, and a base element, on which the carrier element is supported.

2. Background

In many fields of technology, workpieces to be machined are machined or already machined workpieces are inspected with the help of machining devices or inspection machines (or more generally: a processing system), in which a tool head or inspection head is moved relative to the workpiece to be machined or inspected. For purposes of machining or inspecting (or more generally: processing), the tool head/inspection head is here either moved by corresponding actuators, or the workpiece is moved by actuators in a movably arranged workpiece receptacle. It is basically also conceivable that both the tool head/inspection head and the workpiece be moved. Movability here relates to a machine base body or to a workshop, factory or the like, in which the machine is set up.

In cases where especially small structures must be processed (fabricated and/or inspected), use is usually made of the basic principle in which the respective workpiece is moved relative to a stationary base. This is also based in particular on considerations having to do with the respectively present masses: As a rule, the respective workpiece comprises a comparatively small mass (even when also including the mass of the tool receptacle device and the like); in contrast, the respective tool head/inspection head comprises a large mass, in particular relative to the workpiece. It must here be considered that especially small structures typically require the use of expensive tool heads/inspection heads that deliver enough precision; as a rule, this is accompanied by a comparatively large overall size and/or mass. One example for the latter involves processing semiconductor structures (semiconductor microstructures), e.g., microprocessors, but also processing mechanical microstructures.

Another problem in the area of microstructures is here that already comparatively small vibrations can lie on the order of magnitude of the structures to be processed in terms of their amplitude, unless suitable countermeasures are introduced. Such vibrations are naturally to be avoided, since they can render the workpiece unusable or unusable measuring results could result. Vibrations like these can be introduced into the system from outside, e.g., jolts caused by passing operating personnel or vibrations caused by nearby machines. In order to sufficiently reduce vibrations here, decoupling devices are typically used, for example damping elements, on which the actual processing system is supported. The latter bring about a mechanical decoupling between the surrounding space and processing machine, at least within certain limits.

Another problem has to do with disturbances, in particular vibrations, which are caused by the processing system itself. This is because the masses to be moved here also result in acceleration processes or repositioning processes for the masses, which inevitably lead to mechanical vibrations. In addition, the dynamic reaction forces can be conveyed from the positioning device via the carrier element to the base element and its substrate (frame on which the base element is supported), wherein the base element and substrate then conversely exert counterforces onto the carrier element and positioning device based on the action and reaction principle. As a whole, this disadvantageously impairs the stability and precision of the positioning. This effect can sometimes even be enhanced further if active stabilizing devices are provided between the base element and carrier element. The problems described above are encountered on an elevated scale with increasing accelerations or traveling speeds. At the present time, the latter most often constitute the limiting factor on increasing the processing rate of the workpieces. This poses a problem, since lower processing rates lead to elevated costs in manufacturing the respective microstructures. Especially problematical is a case where smaller structures are to be processed as the result of technological progress, for example, new chip generations with reduced structural dimensions.

Various decoupling devices have already been proposed in prior art for diminishing vibrations. One example of the latter is Japanese Patent Specification H2-201913A, which proposes a lighting device that is decoupled from the environment in terms of vibration. An optical system can be moved by means of a moving means relative to a table, on which the workpiece to be machined is secured. Air retaining means are provided between the table and a pedestal carrying the table (along with optical system). The air retaining means are located in a horizontal plane, which separates the pedestal from the table. This results in a decoupling in the vertical direction. Further provided is a frame around the table, wherein the frame is fixedly joined with the pedestal. Air retaining means are also provided between the lateral frame walls and lateral table walls. This enables an improved mechanical decoupling from movements that run parallel to the horizontal plane. A particularly good damping and vibrational decoupling in three dimensions is realized overall. However, the problem of disturbances generated by high traveling rates or high accelerations during the relative movement of the table and optical system is at best inadequately addressed, if at all.

OBJECT AND SUMMARY OF THE INVENTION

Therefore, the object of the invention is to propose a workpiece positioning arrangement with a positioning device for positioning a workpiece, as well as with a decoupling device for the decoupled storage of the positioning device, in which the decoupling device comprises a carrier element, on which the positioning device is arranged, and a base element, on which the carrier element is supported, and which has been improved relative to workpiece positioning arrangements of this type known from prior art.

The present invention achieves this object. It is proposed that a workpiece positioning arrangement, which comprises a positioning device for positioning a workpiece along with a decoupling device for the decoupled storage of the positioning device, and in which the decoupling device comprises a carrier element, on which the positioning device is arranged, and a base element, on which the carrier element is supported, is configured in such a way that for decoupling dynamic reaction forces of the positioning device on the base element the carrier element is supported so that it can move freely at least in a certain range, preferably essentially free of counterforces, in a sliding manner. The positioning device typically involves a device basically comprising two parts. It is here possible that a workpiece to be processed (machined and/or inspected) be movable relative to a processing system (machining system, machining head, inspection system, inspection head, sensor head, etc.). The workpiece is here typically secured to a kind of receiving table, and the receiving table can be moved by means of actuators relative to the main body of the positioning device, which among other things can also comprise the processing system. Purely by way of example, a positioning table basically known from prior art can here be involved. Such positioning tables usually comprise a stationary part (which as a rule is mechanically coupled with the processing unit, in particular coupled in essentially a mechanically rigid manner) as well as a movable part, wherein the movement of the two units relative to each other takes place by means of actuators. Due to the structural design with the decoupling device proposed here, a movement by the movable part of the positioning device triggers a countermovement of the stationary part of the positioning device corresponding thereto as a result of underlying physical laws. As a consequence, the stationary part of the positioning device is not "stationary in the actual sense" to an outside observer while in the operating state. However, the stationary part of the positioning device would be stationary if the decoupling device were turned off, for example, so that the carrier element (and hence the stationary part of the positioning device) can no longer move freely relative to the base element (for example, deactivating a pump for any fluid film storage devices and the like, if any are present). Even though the carrier element and positioning device (in particular the stationary part of the positioning device) are initially components that are independent of each other, and subsequently as a rule mechanically fixedly coupled with each other, it is also possible in the sense of the present invention that the part of the positioning device in question and the carrier element be present "at the outset" as a preassembled, uniform assembly, in particular as a one-piece assembly, if necessary even as an integral assembly. In this regard, reference can potentially be made to a combined carrier element-positioning device part assembly (wherein in particular a part of the stationary part of the positioning device or the stationary part of the positioning device is to be understood). Of course, other formulations are also conceivable.

The base element can be (more or less) fixedly joined with the floor, a wall or the like of a room in which the workpiece positioning arrangement is to be set up. In particular, it is here possible to provide additional decoupling elements or damping elements of the kind basically known in prior art between the base element and floor/wall and the like. To be provided here in particular are elements that enable a damping/decoupling in a perpendicular direction (z-axis). In this context, it is to be noted that the decoupling device proposed here typically enables or makes available predominantly or (essentially) exclusively a decoupling in a horizontal direction (x-y plane). Examples of decoupling/damping devices that are basically known from prior art and act in the z-direction include gas-filled cushions, steel springs, rubber elements and the like. Otherwise, it does no harm if any additional damping/decoupling means that dampen/decouple in the z-direction also effect a damping/decoupling in the x-y direction in addition to the decoupling device proposed herein.

In particular, "dynamic reaction forces" are to be understood as forces that arise based on the Newtonian principle of action and reaction. In other words, if a movable part of the positioning device is moved relative to the stationary part of a positioning device, a (taking into account the respective mass ratios) similar, yet oppositely acting movement (or tendency toward a movement) of the stationary part of the positioning device takes place. Thanks to the decoupling device proposed here, such a stationary part of the positioning device can convert the described "tendency toward a countermovement" essentially "completely into a countermovement", at least in certain ranges. It is to be noted that, given the mass ratios typical for positioning tables between the movable and stationary parts of the latter, the carrier element often remains in an astoundingly small range during the operation of a workpiece positioning arrangement. Accordingly, it is not necessary for the base element to comprise a surface that has been enlarged to an especially great extent relative to the surface area of the carrier element. It is here essential to the invention that the dynamic reaction forces owing to the free movability be completely decoupled from the base element and substrate of the base element (e.g., the frame on which the base element is supported, and/or the floor), so that the base element and substrate in turn cannot exert any counterforces on the carrier element and positioning device. Overall, this enables a highly stable and highly precise positioning with high dynamic movement sequences.

In particular, the ability of the carrier element to move relative to the base element must be understood to involve translational movements and/or rotational movements, which take place especially in (essentially) a horizontal plane (i.e., typically parallel to the surface of the base element "lying above" or the surface of the carrier element "lying below"). The proposed arrangement makes it comparatively easy to increase the processing rate of the workpiece (machining and/or inspection) relative to a known workpiece positioning arrangement, in part significantly. Even so, an elevation in "actuator-induced vibrations" typically does not take place. As a result, the throughput of workpieces to be machined can be increased in part significantly.

An advantageous embodiment of the workpiece positioning arrangement arises when the carrier element is supported on the base element, in particular in a free-floating manner, by means of a fluid film, in particular by means of a liquid film, a lubricant film, an oil film, a gas film and/or an air film. In such an embodiment, the displacement between the carrier element and base element is as a rule especially smooth, so that counterforces are largely minimized (wherein counterforces, in particular owing to friction or hydrodynamic braking forces, can never be completely avoided). In light of the slight friction, a long service life can also be ensured for the workpiece positioning arrangement. Otherwise, such fluid films are basically known in prior art, so that the latter can be prepared in conjunction with the workpiece positioning arrangement proposed herein drawing upon commercially available assemblies, making it possible to reduce the costs for the workpiece positioning arrangement.

It is further proposed that the workpiece positioning arrangement be configured in such a way as to arrange one or more fluid film storage devices, in particular air cushion storage devices, between the carrier element and base element, preferably on the side of the carrier element facing the base element and/or on the side of the base element facing the carrier element. In particular, this case can involve commercially available fluid film storage devices. This makes it possible to again facilitate an especially simple and/or cost-effective structural design for the workpiece positioning arrangement. Maintenance costs can potentially also be realized, since it is easier to replace the fluid film storage devices in question.

Another preferred embodiment of the workpiece positioning arrangement is obtained if the positioning device comprises a stationary part and at least one movable part that can move relative to the stationary part, wherein the ratio between the mass of the at least one movable part of the positioning device and the overall mass of the carrier element and stationary part of the positioning device preferably measures less than ⅕, in particular less than 1/10, preferably less than 1/20, especially preferably less than 1/25. The interval should here lie in particular between zero and the respectively cited value. Such a structural design or such values are often achieved by commercially available positioning tables (possibly after usually slight modifications). This further facilitates a cost-effective structural design of the arrangement. In addition, in particular when using the mentioned mass ratios, the "countermovement" of the carrier element and/or stationary part of the positioning device caused by physical laws owing to dynamic reaction forces is comparatively low. As a result, it is possible in particular to diminish the acceleration/traveling speed of the carrier element relative to the base element, which can result in lower fluid dynamic counterforces or lower frictional forces. The displacement paths of the carrier element are also comparatively small, so that the surface area to be made available by the base element for the carrier element upon which it is to be arranged in a freely movable manner does not inordinately grow. This enables saving of adjustment space, but also to make it possible to reduce costs, in particular for the base element.

In particular, it is proposed for the workpiece positioning arrangement that the positioning device be configured to position the workpiece along at least one linear axis (in particular an x-axis), in particular along at least two linear axes (in particular lying in an x-y plane), preferably along at least three linear axes (in particular an x-y-z spatial coordinate system), specially preferably along at least three linear axes (in particular an x-y-z spatial coordinate system) and around at least one rotational axis (in particular a θ-axis). It is here possible for the x, y and/or z-axis to (partially) form an orthogonal system; however, the use of a (partially) non-orthogonal system is also conceivable. On the one hand, the proposed embodiment makes it possible to essentially realize all relevant processing sequences for the workpiece. On the other hand, positioning a workpiece positioning arrangement of one or several of the aforementioned types allows the positioning device in question to interact with the decoupling device in an especially advantageous and effective manner, so that the workpiece positioning arrangement can bring its intrinsic properties and characteristics to bear in a special way.

It is further proposed that the workpiece positioning arrangement be configured in such a way that the carrier element is supported on the base element, in particular so as to freely move, preferably essentially free of counterforces, in at least a horizontal direction (in particular x-direction), in particular in at least two horizontal directions preferably orthogonal to each other (in particular x-y plane), preferably in all horizontal directions, over a range of at least 3 cm, in particular at least 5 cm, preferably at least 10 cm. Even though it is preferred that two horizontal directions that are orthogonal to each other be used, coordinate systems that deviate therefrom are also conceivable, in particular non-orthogonal ones. The mentioned dimensioning information proves especially advantageous in particular when using the mass ratios described above and/or the structural design of the positioning device proposed above. In particular, the mentioned dimensioning information can be advantageous because it represents a typically especially good compromise between a simple and cost-effective structural design (in particular smallest possible surface of the base element, which correspondingly saves on costs and installation space) and a lowest possible probability for an "impact" by the carrier element (i.e., the probability that the relative displaceability of the carrier element and base element cannot be implemented extensively enough from a geometric standpoint, so that counterforces must be applied, for example, preventing the carrier element from sliding off of the base element, which could lead to serious damages, going as far as the destruction in particular of the positioning device).

An especially preferred embodiment of the workpiece positioning arrangement arises when the carrier element can move, in particular move freely, (i.e., in particular can be displaced and/or rotated) relative to the base element in at least a minimal range, which is derived from a maximum traveling path of the at least one movable part of the positioning device, and from the ratio between the mass of the at least one movable part of the positioning device and the overall mass of the carrier element and stationary part of the positioning device. The calculations required for this purpose are based on elementary physical considerations and formulas for equations of motion. They can be readily performed by the expert tasked with constructing a workpiece positioning arrangement. The embodiment proposed above also makes it possible to realize the aforementioned good compromise between the smallest possible dimensioning in particular for the surface of the base element and the lowest possible probability for the occurrence of counterforces (for example, to prevent the carrier element from sliding down off of the base element). In particular, this is also possible for what are rather "untypical" positioning devices (i.e., in particular positioning devices whose structural design deviates from typical, commercially available positioning devices).

It is further proposed for the workpiece positioning arrangement that at least one limiting device be provided for limiting the free movability between the base element and carrier element. For example, a simple "side fence" (i.e., a kind of frame member) can here be involved. Also conceivable, however, are mechanically acting parts (e.g., springs) or even potentially actively controlled components that can limit free movability (activating a pneumatic actuator, for example, if a certain range of movement is exited or the like). Such a limiting device can be used to easily and effectively prevent the carrier element from sliding down off of the base element, for example, which can lead to serious, potentially even irreparable damages, in particular to the positioning device. The limiting device should here be configured and set up and/or in particular be adjusted in terms of its dimensioning to the workpiece positioning arrangement in such a way that the latter "must intervene" as rarely as possible, which is to apply in particular to typical operating cycles.

In an advantageous further development, it is proposed that the at least one limiting device of the workpiece positioning arrangement be configured as a preferably gently engaging limiting device, and/or that the limiting device comprise a preferably gently engaging stop device, in particular a spring device, an air cushion device and/or a fluid damping device, and/or comprise at least one preferably horizontally acting, especially preferably softly engaging spring, which is arranged between the carrier element and base element. The limiting device or spring is here configured to be so "gently engaging" (e.g., has such a small spring constant) that the carrier element is still movably supported at least in a certain range on the base element essentially free of counterforces. In particular, this makes it possible to largely avoid hard shocks, which in particular could act on the positioning device. As a result, in particular the service life of the positioning device can be increased once again. This also makes it possible to largely avoid impacts "toward the outside" (which in particular could be conveyed to a floor or wall via the base element), which there could yield adverse effects. In borderline cases effectively requiring that the limiting device engage "just now", a gently engaging limiting device potentially enables the latter to engage without even having to result in an error while processing the workpiece. Naturally, this is especially advantageous, since rejects or repeated processing steps can thereby be avoided.

It is further proposed for the workpiece positioning arrangement that the carrier element and/or base element be formed or constructed as a massive body, in particular as a metal body, iron body, cast iron body, mineral casting body, steel body, block of stone, block of marble, block of basalt and/or block of granite. Initial tests have demonstrated that such a structural design or that such materials are especially advantageous. In addition, the mentioned materials or the mentioned structural design tend to be commercially available, which is advantageous (in particular from a cost standpoint as well).

It is further proposed that the base element of the workpiece positioning arrangement comprise a preferably horizontally aligned storage surface that faces the carrier element. Such a structural design makes it possible to realize the proposed decoupling of dynamic reaction forces in an especially easy and effective manner. In addition, the proposed structural design corresponds to the typical structural design of commercially available base elements, which brings with it corresponding advantages.

Another preferred further development of the workpiece positioning arrangement is obtained when the latter comprises at least one zero position means, which is configured and set up to bring the carrier element into a defined zero position and/or into a defined zero position range relative to the base element, in particular in an idle state of the positioning device. The zero position means can involve both active and passive zero position means. In particular given an active design of the zero position means, it is possible for the later "to be turned on" (i.e., exert an effect) precisely when no processing step is taking place. This makes it possible to ensure a secured zero position for the workpiece positioning arrangement without this having negative effects on the workpieces to be processed. The zero position process can then also take place (comparatively) quickly. Additionally or alternatively, it also makes sense to use passive zero position means. In particular passive zero position means can be especially simple in terms of their structural design. The zero position forces of the passive zero position means can here typically "always" arise (in particular given a departure from the zero position or zero position range), meaning even while a workpiece is being processed. However, the zero position forces selected are typically comparatively small, so that the latter are typically slight by comparison to the otherwise arising forces, in particular (essentially) negligible. Mostly, it is only essential here that the zero position forces be selected so as not (under normal operating conditions) to have any (significant) disadvantageous effects on processing the workpiece. The zero position can here relate to one or more translational directions and/or one or more rotational directions. In particular, a zero position means tends to allow the carrier element to always execute the "maximum available" compensation movements relative to the base element, so that in particular the response of a limiting device need only take place especially rarely (if ever).

It is here especially advantageous for the at least one zero position means to be configured as a spring device, a slanted surface device and/or an actively activatable actuator device. For example, the spring device can involve (an array of) springs (metal springs and/or spiral springs or the like), which comprise a comparatively low restoring force (for example a low spring constant). A slanted surface device is typically configured so as to comprise a stable zero point position. For example, this can be realized by giving the base element a slightly concave design. Since the zero position forces are typically only slight, a typically slight curvature as a general rule is enough to prevent any accompanying disadvantageous effects (for example, partial placement of the carrier element on the base element or the like).

In addition, it is proposed for a workpiece positioning arrangement that at least one workpiece processing device be provided, in particular one workpiece machining device and/or at least one workpiece inspection device, wherein the workpiece processing device, workpiece machining device or workpiece inspection device is preferably arranged on the carrier element, and in particular preferably fixedly mechanically coupled thereto. In particular within the framework of the present application, a workpiece processing device is to be understood as a generic term encompassing a workpiece machining device and/or a workpiece inspection device. Accordingly, processing is to be construed as a generic term that covers machining and/or inspection. The structural design of the workpiece positioning arrangement proposed herein can be used to prevent in particular "actuator-induced eigenvibrations". Further obtained as a rule is a mass distribution comprised of the movable part of the positioning device and stationary part of the positioning device, including the carrier element, which is especially advantageous for the workpiece positioning arrangement. In addition, the proposed structural design is typical for commercially available positioning tables, so that the latter can also be used for the proposed workpiece positioning arrangement (possibly after what are most often comparatively slight modifications).

It is especially advantageous that the workpiece positioning arrangement be configured and set up as a workpiece positioning arrangement for processing, machining, lighting and/or inspecting semiconductor structures, microstructures, nanostructures and/or wafers as a workpiece. In such a case, the properties and advantages intrinsic to the workpiece positioning arrangement can be brought to bear to a special degree.

Additional details of the invention, and in particular exemplary embodiments of the proposed device and of the proposed method, will be explained below based on the attached drawings. Shown on:

BRIEF DESCRIPTION OF THE DRAWINGS

FIG. 1b is a side view of the workpiece positioning arrangement according to FIG. 1a;

FIG. 1c is a top view of the workpiece positioning arrangement according to FIG. 1a;

FIG. 2b is a side view of the workpiece positioning arrangement according to FIG. 2a;

FIG. 2c is a top view of the workpiece positioning arrangement according to FIG. 2a.

DETAILED DESCRIPTION OF THE PRESENT INVENTION

Figure 1A:
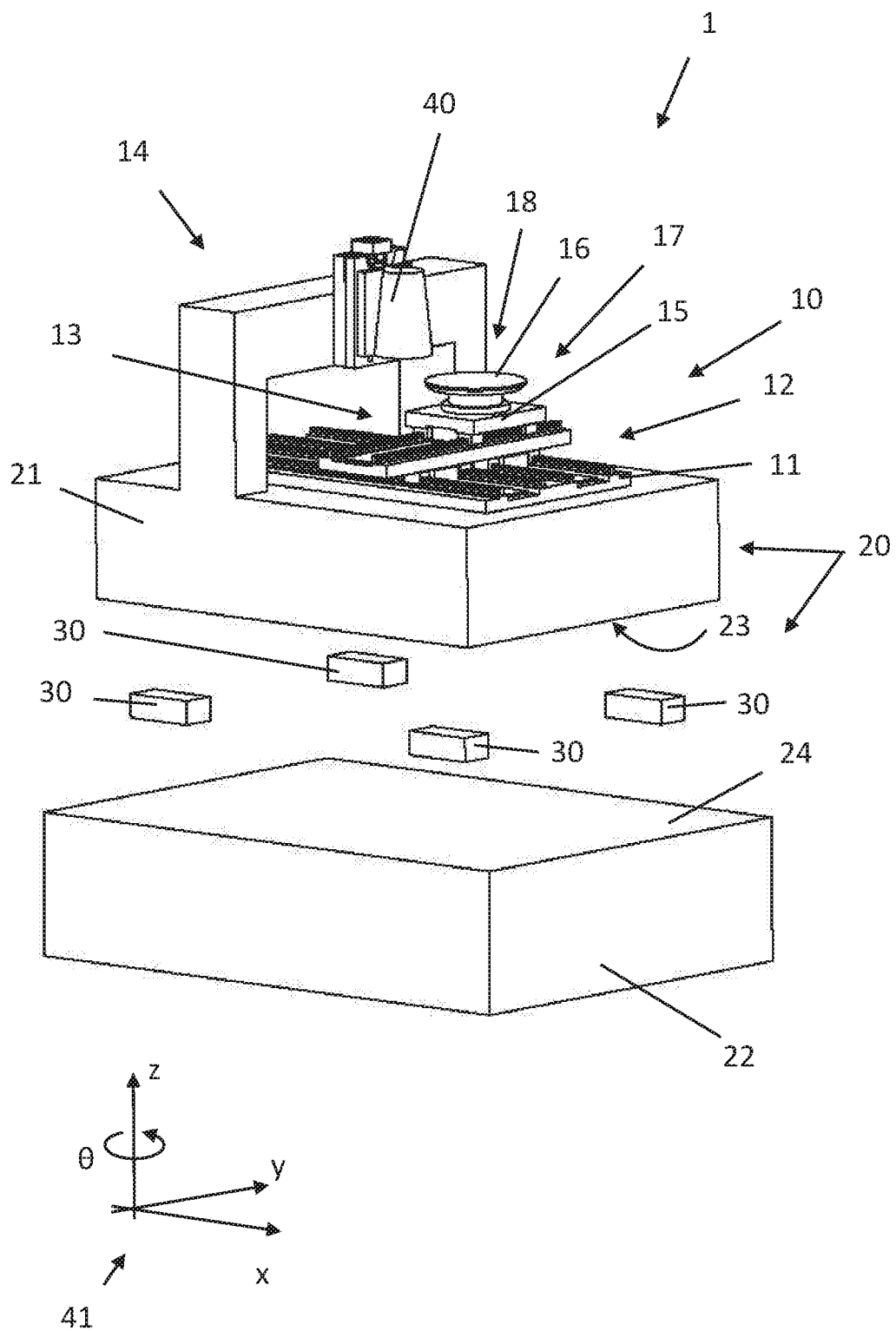
FIG. 1a is a schematic exploded view of a first exemplary embodiment for a workpiece positioning arrangement with sliding processing table.
Figure 1B:
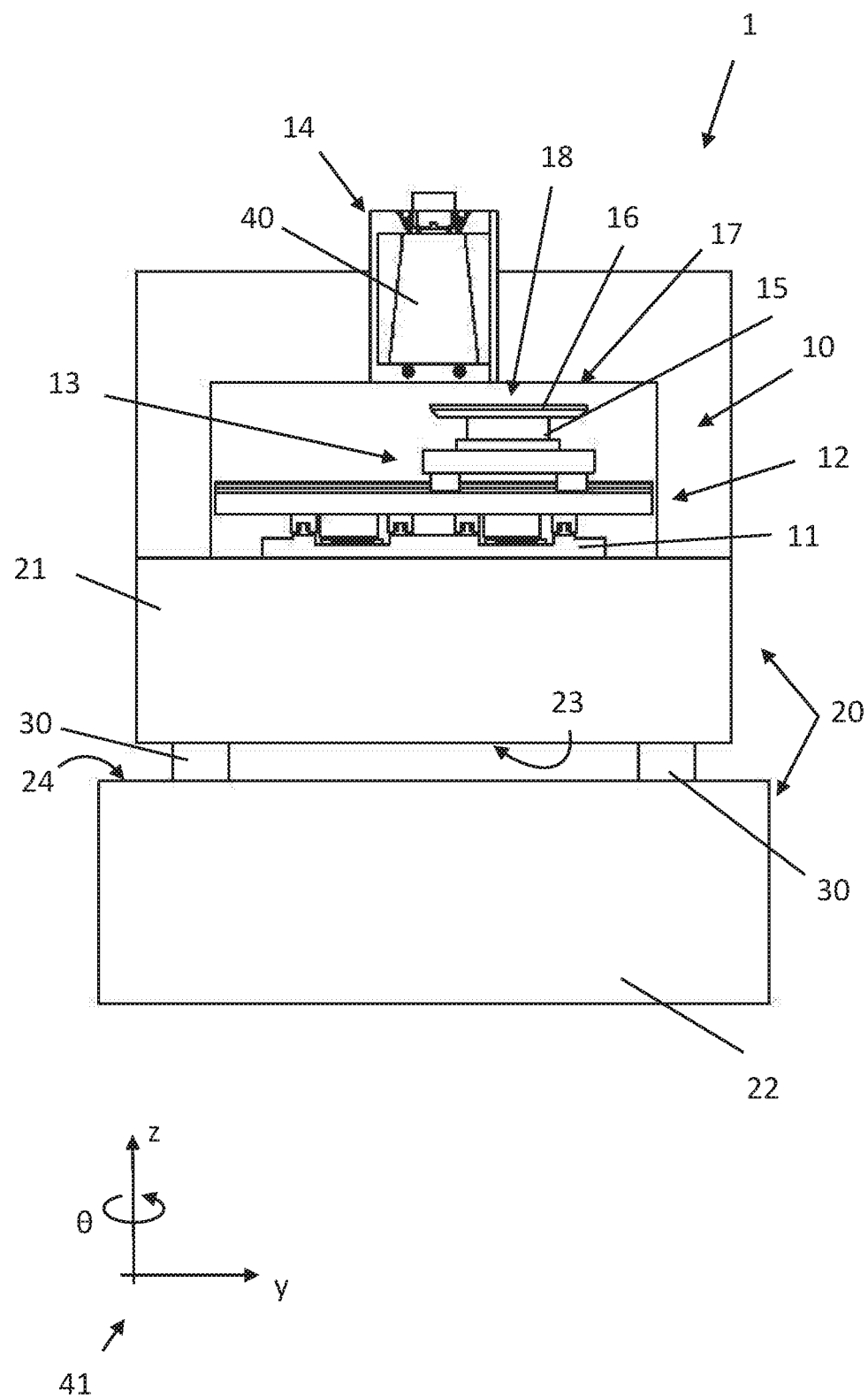
Figure 1C:
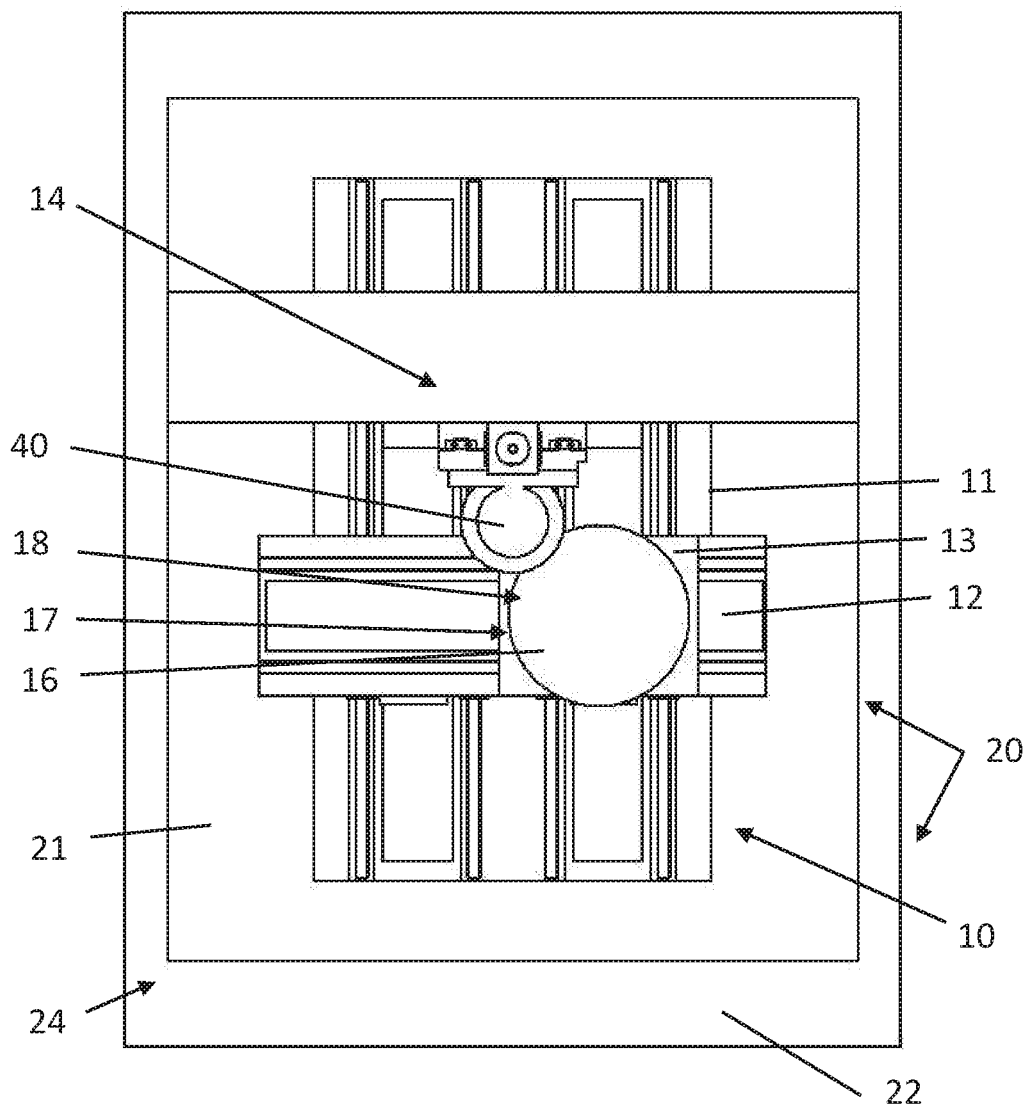
Figure 1C:
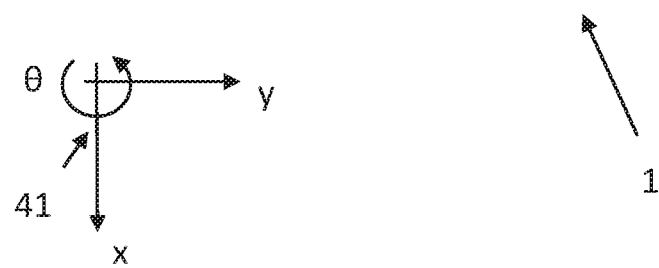

Shown on FIG. 1a-1c is a schematic exploded view of a first possible exemplary embodiment for a processing table 1, for example for semiconductor microstructures or other workpieces.

Actual processing is accomplished with the positioning table 10, which in terms of its basic structural design essentially corresponds to a positioning table of the kind common in prior art and also industrially widely used. The positioning table 10 comprises a pedestal 21, which usually has a comparatively large mass. The pedestal 21 is used to secure the "actually" stationary plate 11 of the positioning table 10, for example which comprises guide rails or travel rails for a movable carriage. The pedestal 21 also has mechanically fixedly secured thereto a support arm 14, on which a processing head 40 is in turn mechanically fixedly secured. As a consequence, the pedestal 21, support arm 14, processing head 40 and stationary plate 11 of the positioning table 10 are mechanically coupled together to form an assembly in which no parts move relative to each other. Of course, this does not rule out having in particular the processing head 40 or pedestal 21 incorporate parts that perform certain movements relative to the "stationary pedestal system" 11, 21, 40.

The pedestal 21 can be used to accommodate additional elements, in particular for accommodating actuators and control electronics (single-board computers, controllers and the like, sensors, etc.). The processing head 40 can also incorporate a wide variety of (sub)assemblies, in particular such as assemblies used in processing a workpiece (i.e., machining, inspecting, measuring, structuring, lighting, etc.).

Arranged on the stationary plate 11 are two movable carriages 12, 13 (first movable carriage 12 and second movable carriage 13), which can be moved in a respective direction by means of corresponding actuators (for example, linear motors). The first movable carriage 12 can here be moved linearly along a straight translational direction (x-direction) relative to the stationary plate 11. To this end, the first movable carriage 12 is displaceably arranged on the stationary plate 11. The second movable carriage 13 (y-direction) is arranged on the first movable carriage 12 so that it can be linearly displaced (translational movement). The second movable carriage 13 is thus only obliquely/indirectly joined with the stationary plate 11. By overlapping two linear (translational) movements (wherein the x- and y-axis are here orthogonal to each other; see also coordinate axes 41, which are recorded on FIG. 1a-1c to illustrate the circumstances), the workpiece to be processed can be (initially) moved in a horizontally lying x-y plane.

A rotary table 17 is in turn arranged on the second movable carriage 13 as an additional component of the positioning table 10, wherein the rotary table base 15 is mechanically fixedly secured to the second movable carriage 13. The rotary plate 16 of the rotary table 17 can be turned relative to the rotary table base 15 by means of an actuator (not shown) (rotational movement in the θ-direction/see coordinate system 41).

As a consequence, a workpiece arranged on the rotary plate 16 or in a workpiece receptacle 18 can also be turned in a direction θ (in particular relative to the respective processing head 40) in addition to being displaced in the x-y plane. Such an adjustability is sufficient for numerous applications (in particular in semiconductor structuring). Any potentially required "deep variation" (of whatever kind) can take place by correspondingly adjusting the processing assemblies arranged in the processing head 40, if necessary. Accordingly, the actual workpiece receiving area 18 (on the rotary plate 16) cannot be adjusted in the z-direction in the exemplary embodiment of a processing table 1 shown on FIG. 1a-1c.

The pedestal 21 of the positioning table 10 is arranged on a base table (base element) 22 so that it can be displaced in a freely sliding manner. For example, the base table 22 consists of a polished granite plate (wherein other materials are also conceivable). The base table 22 is in turn set up in a room, for example via adjusting feet and other damping elements (e.g., gas-filled cushions and the like). The latter can involve a shop, a laboratory, a clean room or a manufacturing facility at a factory.

In order to allow the positioning table 10 and pedestal 21 to be displaced in a freely sliding manner relative to the base table 22, several air cushion bearings 30 (four air cushion bearings 30 in this case) are provided between the bottom side 23 (surface lying below) of the pedestal and the top side 24 (surface lying above) of the base table 22. To ensure that the air cushion bearings 30 remain in a "reasonable position" (i.e., do not wander sideways out of the gap between the pedestal 21 and base table 22), the latter can be secured to the base table 22 or pedestal 21, for example. The arrangement on the pedestal 21 is preferable, since the surface occupied by the pedestal 21 is typically smaller than the top side 24 of the base table 22, which faces the bottom side 23 of the pedestal 21.

The freely sliding movability (displaceability and/or rotatability) provided by the air cushion bearings 30 prevents the vibrations of the positioning table 10 from being able to get into the environment via the base table 22, where they can potentially cause problems in other machines or be coupled back into the system. Conversely, of course, external vibration can also be prevented from being introduced into the positioning table 10 via the base table 22. For example, such vibrations can be generated by machines that are set up next to each other, employees passing by, vehicles driving by in the vicinity, storms or the like. In addition, the freely sliding movability (displaceability and/or rotatability) provided by the air cushions 30 prevents vibrations of the positioning table 10 from being directed into the base table 22, and also back into the positioning table 10 via feedback.

It is to be noted that, during operation of the positioning table 10, the movement (displacement and/or rotation) of the tool receptacle 18 (located on the rotary plate 16 of the rotary table 17) moves masses. When the rotary table 17 rotates around the axis θ, a mass is moved that corresponds to the sum of the mass comprised of the workpiece to be processed and the rotary plate 16 (including workpiece receptacle 18). If this second carriage 13 is moved in the y-direction, a mass is moved that corresponds to the sum of the mass comprised of the workpiece, rotary table 17 (including workpiece receptacle 18) and second movable carriage 13. If the first movable carriage 12 is moved, a mass is moved that corresponds to the sum of the mass comprised of workpiece, rotary table 17 (including workpiece receptacle 18), second movable carriage 13 and first movable carriage 12. For the sake of completeness, it is to be noted that corresponding acceleration and braking processes of the respectively moved masses also arise during a "movement". Based on Newtonian law, a movement by the masses in question triggers a corresponding countermovement by the remaining masses of the positioning table 10. As a consequence, certain movements by the pedestal 21 of the positioning table 10 come about, which are opposite the movements by the workpiece/workpiece receptacle 18. Due to the varying masses ("remaining masses" are as a rule distinctly greater than the respectively moved masses), however, the paths traversed by the pedestal 21 are typically distinctly smaller. For example, if the workpiece/workpiece receptacle 18 is displaced by 10 cm, this only causes a 1 cm displacement of the pedestal 21 (to cite exemplary typical values).

The movement by the pedestal 21 here takes place in a freely sliding manner (including the possibility of rotational movements) relative to the base table 22.

Let it further be noted that, during the typical processing of a workpiece, the movements by the workpiece are to some extent balanced out on average (the workpiece or workpiece receptacle 18 typically goes through a rapid sequence of movements). However, the consequence thereof is that the movements by the pedestal 21 of the positioning table 10 relative to the base table 22 also "balance out on average". As a result, the "excess edge" of the base table 22 relative to the pedestal 21 (enlarged surface of the top side 24 of the base table 22 relative to the surface of the bottom side 23 of the pedestal 21) can be comparatively small. Protruding edges in the 5 cm, 10 cm or 20 cm range are typically completely adequate for normal operating conditions.

Even though this cannot be discerned on FIG. 1a-1c owing to the slight deformation of the top side 24 (surface lying above) of the base table 22, the top side 24 of the base table 22 comprises a slightly concave shape (bowl shape) in the exemplary embodiment shown here. As a result thereof, certain restoring forces are present (even the latter are comparatively small relative to the arising acceleration forces or acceleration counterforces due to a movement by a workpiece/the workpiece receptacle 18), which try to move the pedestal 21/the positioning table 10 back into a defined zero position (stable equilibrium due to potential energy). Naturally, it is also possible for the top side 24 of the base table 22 to comprise a centrally lying flat, horizontally aligned surface, and to provide slightly rising areas in edge regions of the base table 22 (hollow space resembling a truncated pyramid, whose "tip" points downward). A certain zero position range is realized in such a case. If the positioning table 10 is located in this zero position range, it is at an indifferent equilibrium; if it leaves the zero position range, a tendency to return the positioning table 10 to the zero position range comes about.

Figure 2A:
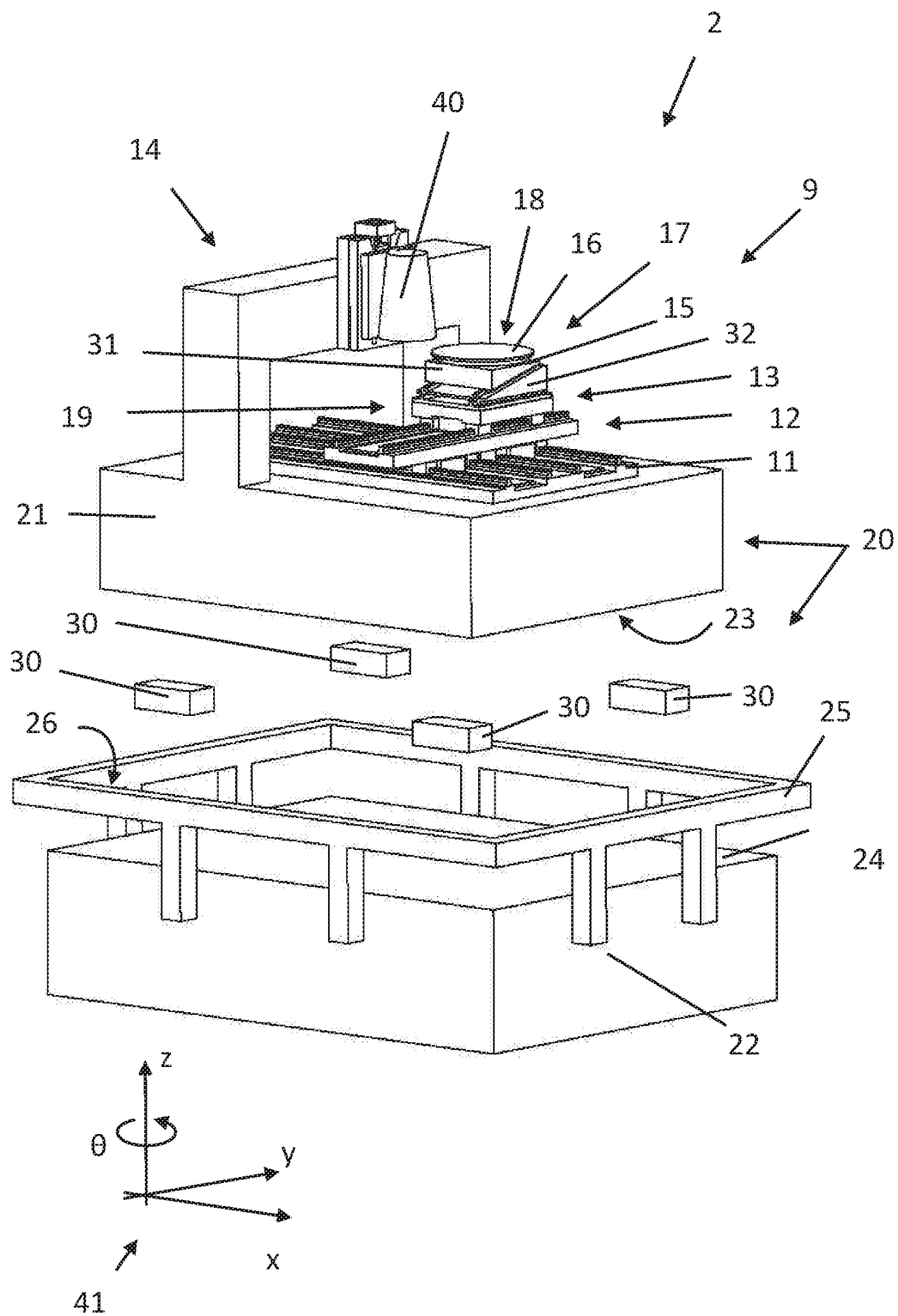
FIG. 2a is a schematic exploded view of a second exemplary embodiment for a workpiece positioning arrangement with sliding processing table.
Figure 2B:
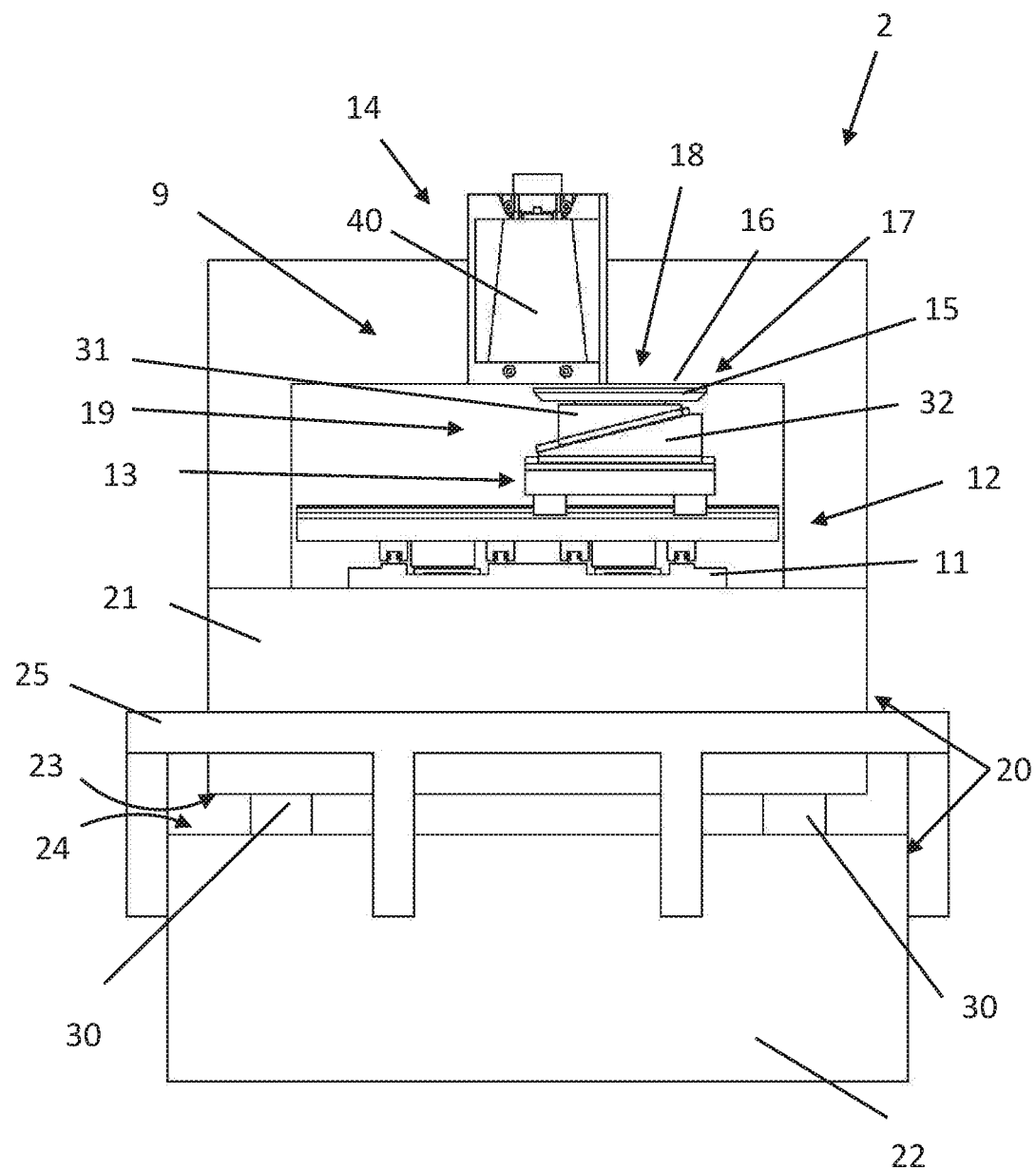
Figure 2C:
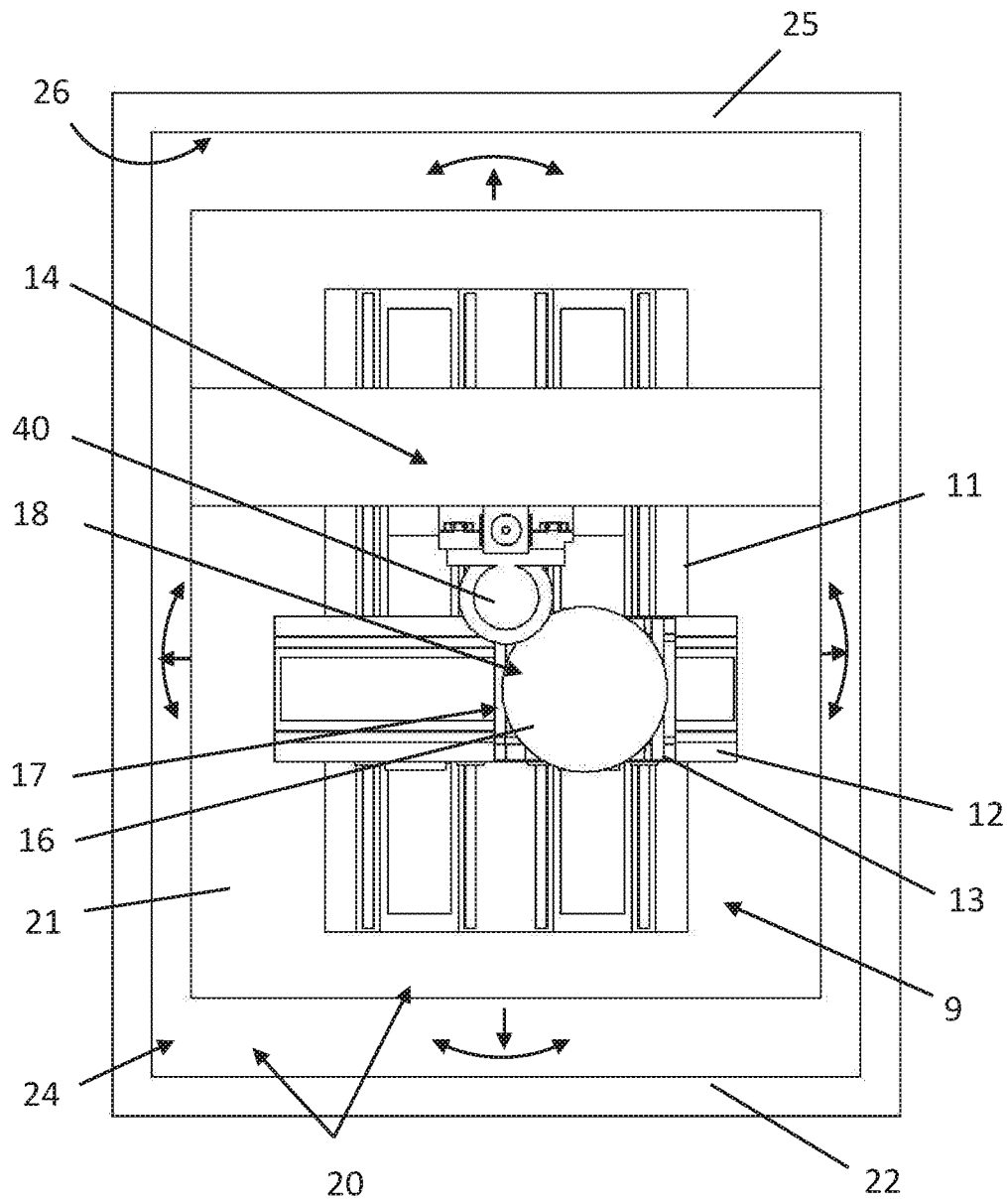
Figure 2C:
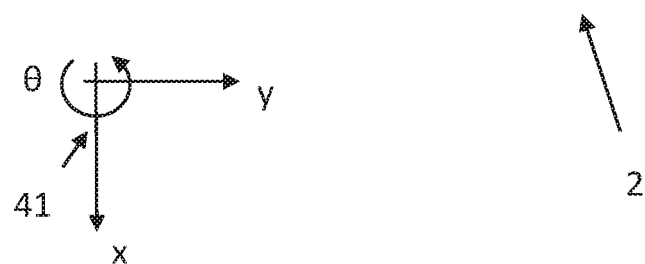

FIG. 2a-2c present a second possible exemplary embodiment for a processing table 2. A larger portion of the assemblies in the processing table 2 shown here correspond to those of the processing table 1 depicted on FIG. 1a-1c. To provide a better understanding, identical reference numbers are used for similar assemblies. However, this does not imply that the assemblies must necessarily be "completely identical" (even though this can be the case). Instead, identical reference numbers must rather be construed to mean that similar (not necessarily identical; even if there can be identity) functions are performed by the parts/assemblies in question. As a consequence, the structural design of the parts/assemblies is also most often similar in this case.

In the presently depicted exemplary embodiment of a processing table 2 according to FIG. 2a-2c as well, a kind of commercially available positioning table 9 that has been subjected to certain modifications is arranged in a freely sliding and displaceable (including rotatable) manner on a top side 24 of a base table 22. In the present exemplary embodiment, the air cushion bearings 30 are partially recessed in the bottom side 23 of the pedestal 21. The free movability (displaceability/rotatability) is denoted by arrows on FIG. 2c.

As with the positioning table 10 according to the exemplary embodiment on FIG. 1a-1c, the positioning table 9 depicted here comprises a stationary plate 11, which is mechanically fixedly secured to the pedestal 21. A first movable carriage 12 is arranged on the stationary plate 11 so that it can be displaced in a translational direction (x-direction; see coordinate system 41 recorded as an overview) and adjusted by means of corresponding actuators. A second movable carriage 13 is in turn arranged on the first movable carriage 12, and is also supported so that it can be displaced in a translational direction by means of actuators (y-direction). The processing table 2 depicted on FIG. 2a-2c is also provided with a rotary table 17, in which a rotary plate 16 lying above with a tool receptacle 18 can be rotated relative to a rotary table base 15 by means of actuators (θ-direction, see coordinate system 41).

The exemplary embodiment of a processing table 2 depicted here also provides a double wedge system 19. The double wedge system 19 is provided between the rotary plate 16 and second movable carriage 13. An upper wedge 31 of the double wedge system 19 is joined with the rotary table 17 (in particular the rotary table base 15), while a lower wedge 32 of the double wedge system 19 is joined with the second movable carriage 13. The height of the rotary table 17, and hence of the workpiece receptacle 18 of the workpiece to be processed, can be varied (adjusted in the z-direction) by displacing the two wedges 31, 32 of the double wedge system 19 against each other (using an actuator not depicted here). Solely for the sake of completeness, it is to be noted that a vertical adjustment in the z-direction also brings with it a displacement in the x-y plane due to the "characteristics" of the double wedge system 19. The double wedge system 19 is here aligned in such a way that a vertical adjustment in the z-direction brings with it a displacement in the y-direction as an additional component. However, this displacement in the y-direction can be easily offset by a corresponding "correction" in the position of the second movable carriage 13. To this end, the control electronics only has to send suitable control commands to the actuators in question, which are present anyway.

In another deviation of the processing table 2 depicted here from the processing table 1 shown on FIG. 1a-1c, the top side 24 of the base table 22 here has a flat, horizontal design (i.e., comprises no concave depression). In order to prevent the positioning table 9 from sliding down off of the base table 22, a stop frame 25 is here provided in the area of the outer edges of the top side 24 of the base table 22. A respective rubber pad 26 is provided on the respective inner sides of the stop frame 25. As a result, the stop device engages comparatively "gently". This prevents the positioning table 9 from being exposed to vibrations. Over time, repeated (in particular stronger) vibrations of the positioning table 9 can cause damage to parts of the positioning table 9 or result in a failure of components comprising the positioning table 9. In addition, the gentle engagement of the stop frame 25 by means of rubber pads 26 could potentially also avoid problems in processing the workpiece to be processed (for example, faulty machining owing to shock loads), above all when the positioning table 9 or pedestal 21 of the positioning table 9 impacts the stop frame 25 "just now" (i.e., at a lower residual speed).

Of course, zero position means can also be provided in addition (or alternatively) to the stop frame 25 depicted here, for example a concave depression, mechanical springs with low spring forces and the like.

What is claimed is:

1. A workpiece positioning arrangement comprising a positioning device for positioning a workpiece as well as a decoupling device for the decoupled storage of the positioning device, wherein the decoupling device comprises a carrier element, on which the positioning device is arranged, and a base element, on which the carrier element is supported, wherein the positioning device comprises a stationary part and at least one movable part, the stationary part of the positioning device being secured to the carrier element so that the stationary part is not movable with respect to the carrier element, wherein the at least one movable part of the positioning device is movable relative to the stationary part so that the workpiece is enabled to be moved with respect to the stationary part and dynamic reaction forces acting on stationary part are induced upon a movement of the at least one part with respect to the stationary part, wherein, for decoupling the base element from the dynamic reaction forces acting on the stationary part upon the movement of the at least one movable part with respect to the stationary part, the carrier element is supported on the base element so as to move freely in response to the dynamic reaction forces at least in a certain range, preferably essentially free of counterforces, in a sliding manner.

2. The workpiece positioning arrangement according to claim 1, wherein the carrier element is supported on the base element by means of a fluid film, in particular a liquid film, a lubricant film, an oil film, a gas film and/or an air film.

3. The workpiece positioning arrangement according to claim 2, wherein one or more fluid film storage devices, in particular air cushion storage devices, are arranged between the carrier element and base element, preferably on the side of the carrier element facing the base element and/or on the side of the base element facing the earner element.

4. The workpiece positioning arrangement according to claim 1, wherein the ratio between the mass of the at least one movable part of the positioning device and the overall mass of the carrier element and the stationary part of the positioning device preferably measures less than ⅕, in particular less than 1/10, preferably less than 1/20, especially preferably less than 1/25.

5. The workpiece positioning arrangement according to claim 1, wherein the positioning device is configured to position the workpiece along at least one linear axis (x), in particular along at least two linear axes (x, y), preferably along at least three linear axes (x, y, z), especially preferably along at least three linear axes (x, y, z), and around at least one rotational axis (θ).

6. The workpiece positioning arrangement according to claim 1, wherein the carrier element is supported on the base element so as to move, in particular freely, preferably essentially free of counterforces, in at least a horizontal direction (x), in particular in at least two horizontal directions preferably orthogonal to each other (x, y), preferably in all horizontal directions, over a range of at least 3 cm, in particular at least 5 cm, preferably at least 10 cm, especially preferably at last 20 cm.

7. The workpiece positioning arrangement according to claim 1, wherein the carrier element is movable, in particular freely movable, relative to the base element in at least a minimal range, which is derived from a maximum traveling path of the at least one movable part of the positioning device and from the ratio between the mass of the at least one movable part of the positioning device and the overall mass of the carrier element and stationary part of the positioning device.

8. The workpiece positioning arrangement according to claim 1, wherein at least one limiting device for limiting the free movability is between the base element and carrier element.

9. The workpiece positioning arrangement according to claim 8, wherein the at least one limiting device is configured as a preferably gently engaging limiting device, and/or that the limiting device comprises a preferably gently engaging stop device, in particular a spring device, an air cushion device and/or a fluid damping device, and or comprises at least one preferably horizontally acting, especially preferably softly engaging spring, which is arranged between the carrier element and base element.

10. The workpiece positioning arrangement according to claim 1, wherein the carrier element and/or the base element are constructed as a massive body, in particular as a metal body, iron body, cast iron body, mineral casting body, steel body, block of stone, block of marble, block of basalt and/or block of granite.

11. The workpiece positioning arrangement according to claim 1, wherein the base element comprises a preferably horizontally aligned storage surface facing the carrier element.

12. The workpiece positioning arrangement according to claim 1, wherein at least one zero position means is configured and set up to bring the carrier element into a defined zero position and/or into a defined zero position range relative to the base element, in particular in an idle state of the positioning device.

13. The workpiece positioning arrangement according to claim 12, wherein the at least one zero position means is configured as a spring device, a slanted surface device and/or an activatable actuator device.

14. The workpiece positioning arrangement according to claim 1, wherein at least one workpiece processing device, in particular at least one workpiece machining device and/or at least one workpiece inspection device, are preferably arranged on the carrier element, and in particular preferably fixedly mechanically coupled thereto.

15. The workpiece positioning arrangement according to claim 1, wherein the workpiece positioning arrangement is configured and set up for processing, machining, lighting and/or inspecting semiconductor structures, microstructures, nanostructures and/or wafers as a workpiece.

\* \* \* \* \*